US011032943B2

(12) United States Patent
Li et al.

(10) Patent No.: US 11,032,943 B2
(45) Date of Patent: Jun. 8, 2021

(54) HEAT DISSIPATION APPARATUS AND HEAT DISSIPATION SYSTEM USING THE APPARATUS

(71) Applicant: HONGFUJIN PRECISION ELECTRONICS(TIANJIN)CO.,LTD., Tianjin (CN)

(72) Inventors: Han-Yu Li, New Taipei (TW); Zhen-Lei Li, Tianjin (CN); Fei Yan, Tianjin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/823,549

(22) Filed: Mar. 19, 2020

(65) Prior Publication Data
US 2021/0144882 A1  May 13, 2021

(30) Foreign Application Priority Data

Nov. 11, 2019 (CN) .......................... 201911096361.X

(51) Int. Cl.
*H05K 7/20* (2006.01)
(52) U.S. Cl.
CPC ....... *H05K 7/2039* (2013.01); *H05K 7/20263* (2013.01); *H05K 7/20272* (2013.01)
(58) Field of Classification Search
CPC .......... H05K 7/20236; H05K 7/20772; H05K 7/203; H05K 7/20781; H05K 7/20272; H05K 7/20809; H05K 7/20263; H05K 7/20763; G06F 2200/201
See application file for complete search history.

(56) References Cited

U.S. PATENT DOCUMENTS

| | | | |
|---|---|---|---|
| 10,257,960 B1* | 4/2019 | Banerjee | H05K 7/20327 |
| 10,321,603 B1* | 6/2019 | Banerjee | H05K 7/20236 |
| 2014/0301037 A1* | 10/2014 | Best | H05K 7/20781 |
| | | | 361/679.53 |
| 2017/0273223 A1* | 9/2017 | Saito | H01L 23/44 |
| 2017/0280587 A1* | 9/2017 | Watanabe | H05K 7/20272 |
| 2017/0311479 A1* | 10/2017 | Barragy | H05K 7/1488 |
| 2018/0084671 A1* | 3/2018 | Matsumoto | H05K 7/20772 |
| 2019/0357379 A1* | 11/2019 | Kolar | H05K 7/20827 |
| 2020/0025451 A1* | 1/2020 | Stone | F28D 5/02 |

FOREIGN PATENT DOCUMENTS

| | | |
|---|---|---|
| CN | 201580025 U | 9/2010 |
| CN | 110392516 A | 10/2019 |

\* cited by examiner

*Primary Examiner* — Adam B Dravininkas
(74) *Attorney, Agent, or Firm* — ScienBiziP, P.C.

(57) ABSTRACT

A heat dissipation apparatus for a plurality of heat-generating electrical devices dissipates heat of the heat-generating electrical devices by using heat-absorbing liquid. The apparatus includes a container. The container contains coolant liquid and the plurality of heat-generating electrical devices, the container includes a bottom plate, two first side plates, and two second side plates; the first side plate is fixedly connected to the bottom plate by plastic welding, the second side plate is fixedly connected to the bottom plate by plastic welding, and the first side plate is fixedly connected to the second side plate by plastic welding.

20 Claims, 4 Drawing Sheets

_US 11,032,943 B2_

HEAT DISSIPATION APPARATUS AND HEAT DISSIPATION SYSTEM USING THE APPARATUS

FIELD

The subject matter herein generally relates to crush-proofing heat dissipation apparatus.

BACKGROUND

The submerged liquid-cooled server uses stainless steel heat sinks to be fully welded to achieve the functions of sealing, load bearing and pressure bearing. However, the overall welding method is inefficient and costly.

An improvement is required.

BRIEF DESCRIPTION OF THE DRAWINGS

Implementations of the present disclosure will now be described, by way of embodiments, with reference to the attached figures.

DETAILED DESCRIPTION

Figure 1:
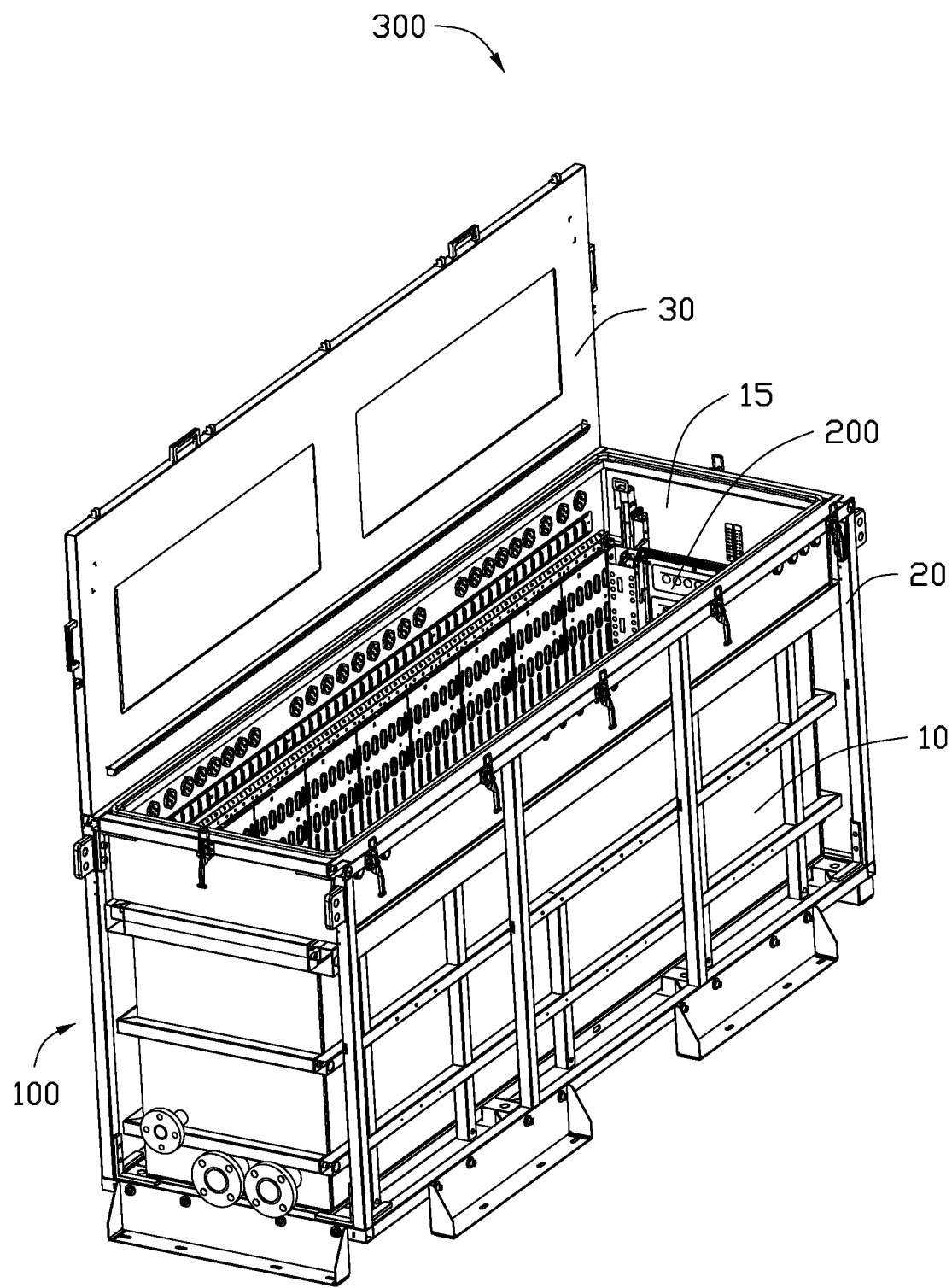
FIG. 1 is a schematic diagram of an embodiment of a heat dissipation system.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 illustrates a heat dissipation system 300 in accordance with an embodiment of the present disclosure. The heat dissipation system 300 includes a heat dissipation apparatus 100 and a plurality of heat-generating electrical devices 200.

The heat dissipation apparatus 100 dissipates heat of the plurality of heat-generating electrical devices 200.

In at least one embodiment, the electrical device 200 can be a server.

In at least one embodiment, the heat dissipation apparatus 100 includes a container 10, a bracket 20, and a cover plate 30.

The container 10 contains coolant liquid (not shown) and the plurality of heat-generating electrical devices 200. The plurality of heat-generating electrical devices 200 can be installed inside of the container 10 and can be submerged in the coolant liquid.

The bracket 20 is sleeved on the outside of the container 10 for receiving and carrying the container 10. The container 10 defines a first opening 15, one end of the cover plate 30 is movably connected to the bracket 20 and can cover the first opening 15 of the container 10.

Figure 2:
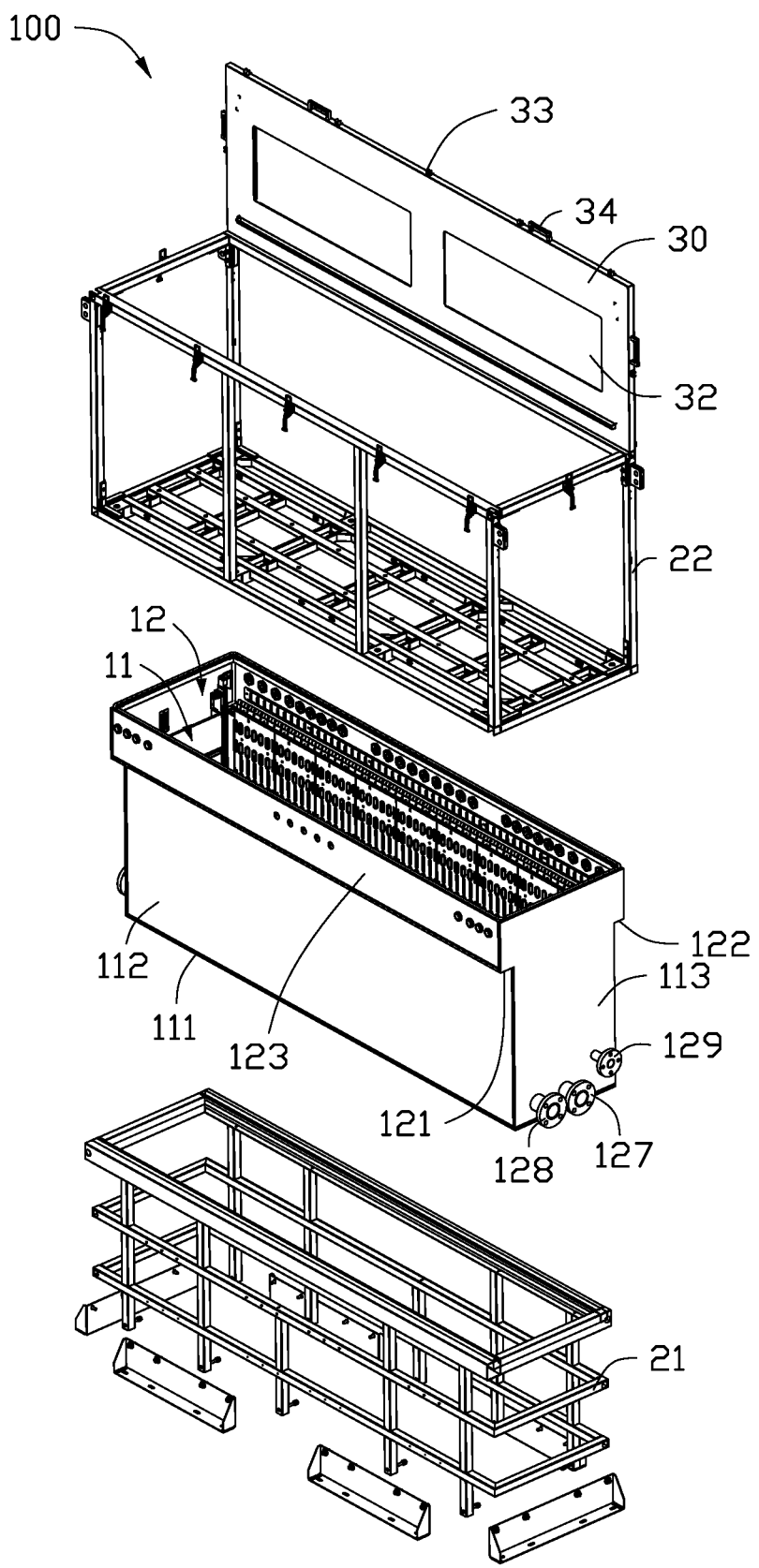
FIG. 2 is an exploded view of an embodiment of a heat dissipation apparatus.

FIG. 2 illustrates that the container 10 includes a bottom plate 111, two first side plates 112, and two second side plates 113. The two first side plates 112 are oppositely disposed, and the two second side plates 113 are oppositely disposed.

The bottom plate 111, the two first side plates 112, and the two second side plates 113 form a first accommodation space 11 for placing the plurality of heat-generating electrical devices 200.

In at least one embodiment, the first side plate 112 is fixedly connected to the bottom plate 111 by plastic welding, the second side plate 113 is fixedly connected to the bottom plate 111 by plastic welding, and the first side plate 112 is fixedly connected to the second side plate 113 by plastic welding.

In at least one embodiment, the two second side plates 113 are T-shaped.

The container 10 further includes a first slot plate 121, a second slot plate 122, and two third side plates 123. The two third side plates 123 are oppositely disposed.

In at least one embodiment, the first slot plate 121, the second slot plate 122, the two third side plates 123, and the two second side plates 113 form a second accommodation space 12.

In the embodiment, the first slot plate 121 is vertically connected to a first end of the two second side plates 113 by plastic welding, the second slot plate 122 is vertically connected to a second end of the two second side plates 113 by plastic welding, and the two third side plate 123 is vertically connected to the first slot plate 121 and the second slot plate 122 by plastic welding.

In the embodiment, the second side plate 113 defines a liquid inlet 127, a first liquid outlet 128 and a second liquid outlet 129.

The liquid inlet 127, the first liquid outlet 128, and the second liquid outlet 129 are all disposed at the lower portion of the second side plate 113. The liquid inlet 127 introduces the coolant liquid into the container 10, and the first liquid outlet 128 and the second liquid outlet 129 discharges the coolant liquid from the container 10.

Figure 3:
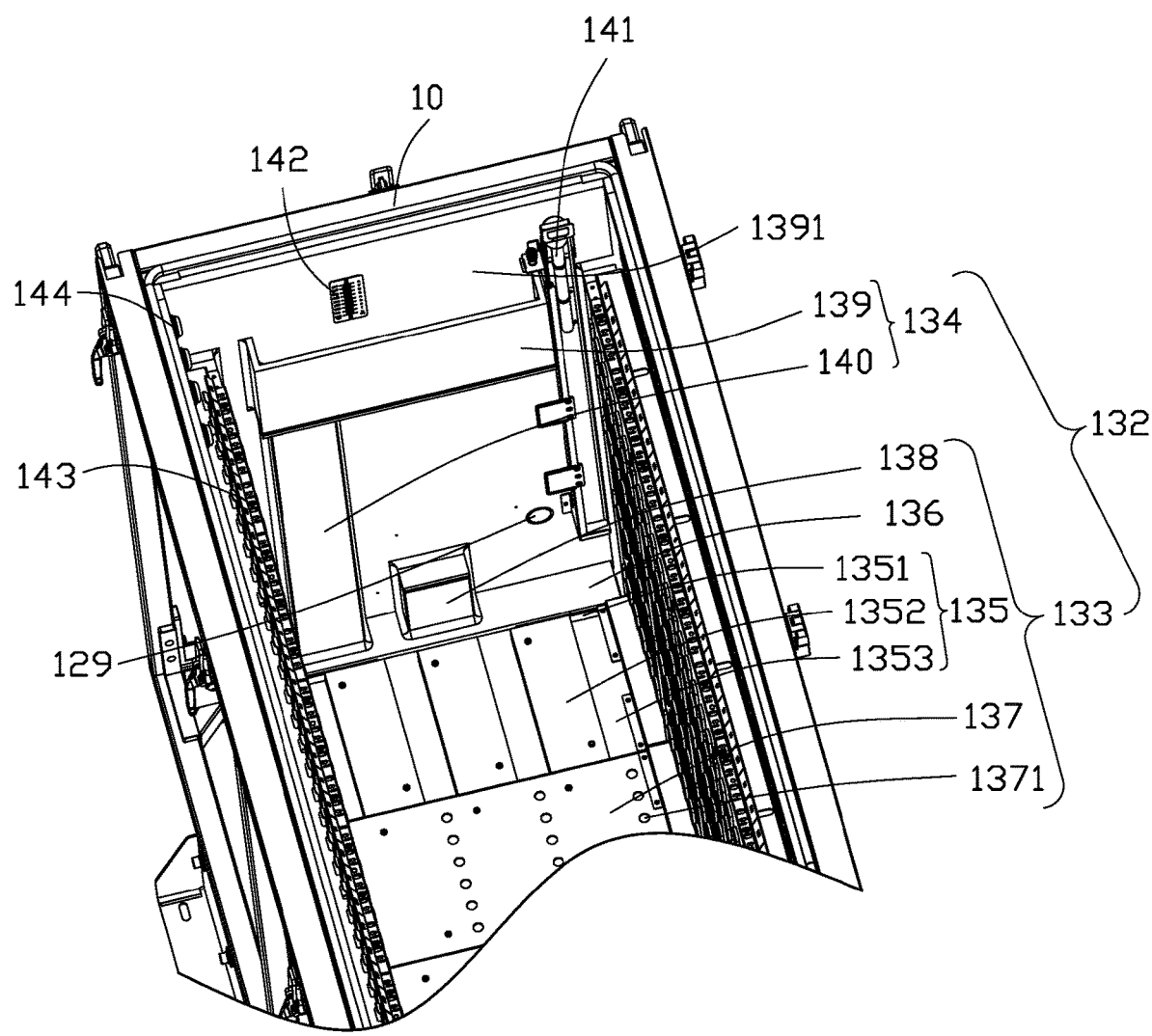
FIG. 3 is a schematic diagram of the heat dissipation apparatus.

FIG. 3 illustrates that a diversion module 132, a temperature measuring device 141, a depth gauge 142, a support member 143, and a cable opening 144 are placed in the container 10. The temperature measuring device 141, the depth gauge 142, the support member 143, and the cable opening 144 are disposed on the second side plate 113.

The diversion module 132 is configured to introduce the coolant liquid into the container 10. The diversion module 132 is also configured to lead the coolant liquid out of the container 10.

The diversion module 132 includes a liquid inlet portion 133 and liquid outlet portion 134.

The liquid inlet portion 133 is provided corresponding to the liquid inlet 127.

The liquid inlet portion 133 includes a cushion block 135, a baffle 136, a deflector 137, and a restriction box 138.

The cushion block 135 includes a plurality of first blocks 1351 and a plurality of second blocks 1352.

In the embodiment, the number of the first blocks 1351 is four, and these first blocks 1351 can be respectively disposed at four top corners of the bottom plate 111 of the container 10. The baffle 136 is disposed on the first block 1351, and the baffle 136 does not contact the bottom plate 111 of the container 10. The baffle 136 is provided with a gap (not shown) at a position corresponding to the liquid inlet 127.

The plurality of second blocks 1352 are arranged side by side on the bottom plate 111 of the container 10, and the second blocks 1352 are spaced from each other to form a diversion channel 1353. The diversion channel 1353 forms a channel opening on the side close to the liquid inlet 127, and the coolant liquid can enter the diversion channel 1353 through the liquid inlet 127.

The deflector 137 is disposed on the second block 1352. The deflector 137 defines a deflector hole 1371, and the deflector hole 1371 corresponds to the diversion channel 1353.

The restriction box 138 is fixedly disposed on the second side plate 113 and covers the liquid inlet 127. The restriction box 138 defines a second opening (not shown), the second opening corresponds to the gap on the baffle 136, and is used to introduce the coolant liquid into the diversion channel 1353 through the liquid inlet 127.

When the coolant liquid is input to the container 10, the coolant liquid enters through the liquid inlet 127 and then passes through the restriction box 138, and enters the diversion channel 1353 through the second opening of the restriction box 138 and the gap of the baffle 136.

When the coolant liquid overflows the diversion channel 1353, the coolant liquid overflows upward through the deflector hole 1371. Finally, the coolant liquid gradually immerses the electronic devices in the container 10 from bottom to top.

The liquid outlet portion 134 is provided corresponding to the first liquid outlet 128. The liquid outlet portion 134 includes a guide groove 139 and a guide pipe 140.

The guide groove 139 is disposed on an upper portion of the second side plate 113, and is disposed above the first liquid outlet 128. The guide groove 139 defines a third opening 1391, and a top of the guide groove 139 is parallel to the first slot plate 121 and the second slot plate 122. A through hole (not shown) is formed on a side of the guide groove 139 near the first liquid outlet 128. In the embodiment, the guide pipe 140 is disposed below the guide groove 139.

The guide pipe 140 is disposed corresponding to the through hole of the guiding groove 139, and the guide groove 139 is connected to the guide pipe 140. The guide pipe 140 covers the first liquid outlet 128, and the first liquid outlet 128, the guide pipe 140, and the guide groove 139 communicate with each other.

When the liquid level of the coolant liquid is higher than the guide groove 139, the coolant liquid will be discharged from the container 10 through the guide groove 139, the guide pipe 140, and the first liquid outlet 128.

The temperature measuring device 141 is used to measure the temperature of the coolant liquid. In one embodiment, the temperature measuring device 141 may be disposed at an intersection of the first side plate 112 and the second side plate 113.

The depth gauge 142 is disposed above the guide groove 139. In one embodiment, the depth gauge 142 may be an iron piece, the iron piece is engraved with a depth value, and the height of the coolant liquid in the container 10 can be obtained by observing the depth value.

The support member 143 is used to carry the electronic devices 200. In the embodiment, the support member 143 is disposed on a surface of the first side plate 112.

The cable opening 144 is disposed on the upper portion of the first side plate 112, and the cable opening 144 is configured to receive the cables of the electronic devices 200 through.

The bracket 20 includes a first bracket 21 and a second bracket 22. The first bracket 21 and the second bracket 22 are rectangular bodies with edges formed by square tubes.

The first bracket 21 is used to carry and receive the container 10. A top portion of the first bracket 21 abuts the first slot plate 121 and the second slot plate 122 of the container 10.

The second bracket 22 is used to receive the first bracket 21 and the container 10.

In the embodiment, the first bracket 21 and the second bracket 22 may be metal pipe outer frames.

The cover plate 30 is movably connected to an end on the top portion of the second bracket 22, and can be covered with the container 10. In the embodiment, a transparent plate 32 is embedded in the cover plate 30, and the inside of the container 10 can be observed.

The cover plate 30 includes a lock member 33, and the lock member 33 is used to fasten the cover 30 with the second bracket 22, to improve the security of the heat dissipation apparatus 100. In the embodiment, the lock member 33 is disposed on a side of the cover plate 30 near an upper of a front plate (not shown).

In the embodiment, the cover plate 30 further includes a handle 34, and the handle 34 is used to open the cover 30.

In the embodiment, the container 10 can be made by the following methods:

First, according to the requirements of pressure and pressure, choose a suitable thickness of thermoplastic plastic sheet; then cut the thermoplastic plastic sheet according to the required size; then fill the C edge (shown in FIG. 4) on the edge of the sheet to fill the electrode material according to the requirements of internal and external welding; finally, adjust the hot gas temperature of the welding gun to 350 degrees, and the air flow velocity is adjusted to 16-60 liters/zone; the angle between the electrode and the welding piece is adjusted as close as possible to 90 degrees; the hot gas of the welding gun is simultaneously blown to the electrode and the welding piece; when the electrode and the welding piece are melted at the same time, move the welding torch along the weld at a speed of 0.1-0.3 m/min in the form of a pendulum and gradually press the electrode into the weld, to make the electrode and weld pieces tightly connected.

The container 10 is made of hot-melt plastic sheet by splicing using the above-mentioned inner and outer plastic welding processes. The plastic welding process can heat the hot-melt plastic sheet to reach the melting point, and the molecules in the plastic sheet are detached and then re-pressed together by external force.

After the hot-melt plastic sheet is heated to its melting point, the molecules of the hot-melt plastic will swell and loosen, and the molecular voids generated by the hot-melt plastic sheet have the same viscosity. At this time, the molecules can be rejoined together by applying external pressure. After the temperature is reduced to normal temperature, welding is completed and a new structure is formed.

The molecules of this new structure have not changed, so the weld has the same chemical and physical properties as the original material, so the weld is not prone to leaking.

Plastic welding splicing plates are usually heated electrically, and compressed air or inert gas is heated by the resistance wire of the welding gun. Heat to the temperature required to weld the plastic, and then use this preheated gas to heat the weldment and the electrode to make it viscous and combine.

Figure 4:
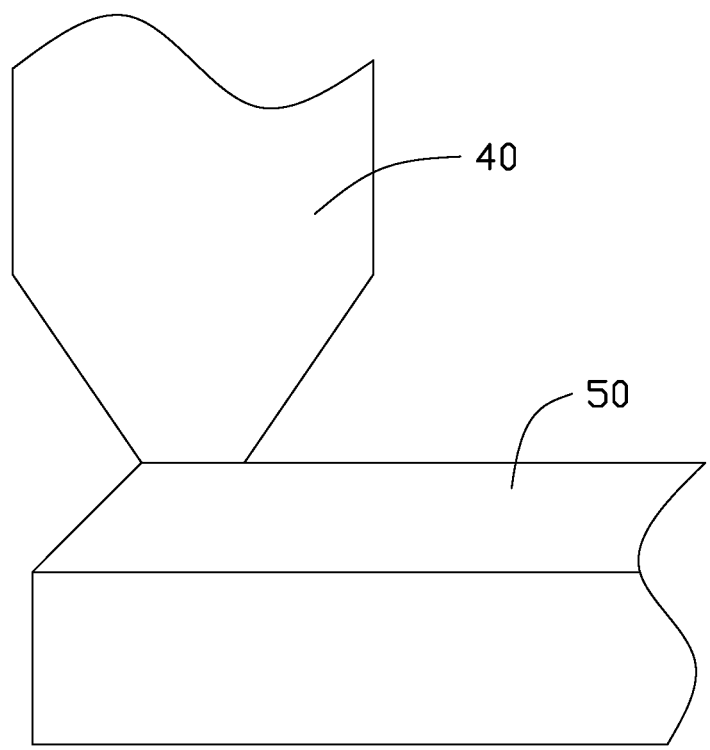
FIG. 4 is a schematic view of a weld of the plastic welding method adopted in a container of FIG. 2.

Referring to FIG. 4, during the plastic welding process of the container 10, the welding seam adopts an inner and outer double V shape. Cut the welding edges of the first to-be-welded plate 40 and the second to-be-welded plate 50 to form a chamfered C, and join the two plates with the chamfered C to form an inner and outer double V-shaped weld. The V-shaped weld is used for filling the electrode material, so that the plates are joined together.

In the embodiment, the material of the container 10 includes, but is not limited to, polypropylene, modified polypropylene, polyethylene and polyethylene terephthalate. The container 10 made by plastic welding in this embodiment has the advantages of low price, light weight, easy processing, easy welding, and chemical resistance.

In the embodiment, the baffle 136, the restriction box 138, the guiding groove 139, and the guide pipe 140 are all assembled with the container 10 by a plastic sheet through a plastic welding process.

In the embodiment, the coolant liquid may be a non-conductive insulating liquid, and the electronic devices 200 immersed in the coolant liquid will not cause a short circuit fault during operation.

In one embodiment, the heat dissipation system 300 includes a plurality of heat dissipation apparatus 100, a plurality of heat-generating electrical devices 200, and a cooling cycle device (not shown). The cooling cycle device is used to receive the coolant liquid with a certain temperature output by the plurality of heat dissipation apparatus 100 and cool the coolant liquid. Thereby, the cooled coolant liquid can be sent to the container 10, so as to achieve the recycling of the coolant liquid.

In one embodiment, the plurality of heat dissipation apparatus 100 are also communicated with each other through the second liquid outlet 129, so that the heights of the coolants in the plurality of heat container 10 are the same, thereby achieving the purpose of saving the coolant.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A heat dissipation apparatus configured for dissipating heat of a plurality of heat-generating electrical devices and comprising:
    a container containing coolant liquid and the plurality of heat-generating electrical devices and comprising:
    a bottom plate;
    two first side plates; wherein the two first side plates are oppositely disposed;
    two second side plates; wherein the two second side plates are oppositely disposed;
    wherein the bottom plate, the two first side plates, and the two second side plates forms a first accommodation space for placing the plurality of heat-generating electrical devices;
    wherein the first side plate is fixedly connected to the bottom plate by plastic welding, the second side plate is fixedly connected to the bottom plate by plastic welding, and the first side plate is fixedly connected to the second side plate by plastic welding;
    wherein a diversion module is disposed in the container, the diversion module regulates the coolant liquid into the container, the diversion module comprises a liquid inlet portion, the liquid inlet portion comprises a cushion block, the cushion block comprises a plurality of second blocks, and the second blocks are spaced from each other to form a diversion channel.

2. The heat dissipation apparatus according to claim 1, wherein the heat dissipation apparatus further comprises a bracket, and the bracket is sleeved on the outside of the container for receiving and carrying the container.

3. The heat dissipation apparatus according to claim 2, wherein the heat dissipation apparatus further comprises a cover plate, the container defines a first opening, one end of the cover plate is movably connected to the bracket and can cover the first opening of the container.

4. The heat dissipation apparatus according to claim 1, wherein the container further comprises a first slot plate, a second slot plate, and two third side plates, and the two third side plates are oppositely disposed; wherein the first slot plate, the second slot plate, the two third side plates, and the two second side plates form a second accommodation space; and wherein the first slot plate is vertically connected to the two second side plates by plastic welding, the second slot plate is vertically connected to the two second side plates by plastic welding, and the two third side plate is vertically connected to the first slot plate and the second slot plate by plastic welding.

5. The heat dissipation apparatus according to claim 4, wherein the second side plate defines a liquid inlet, a first liquid outlet and a second liquid outlet; and wherein the liquid inlet introduces the coolant liquid into the container, and the first liquid outlet and the second liquid outlet discharges the coolant liquid from the container.

6. The heat dissipation apparatus according to claim 5, wherein the diversion module further leads the coolant liquid out of the container.

7. The heat dissipation apparatus according to claim 6, wherein the liquid inlet portion further comprises a baffle, a deflector, and a restriction box, and the cushion block further comprises a plurality of first blocks; wherein the plurality of second blocks are arranged side by side on the bottom plate of the container, and the baffle cover the diversion channel; wherein the deflector is disposed on the second block, the deflector defines a deflector hole, and the deflector hole corresponds to the diversion channel; and wherein the restriction box is fixedly disposed on the second side plate and covers the liquid inlet.

8. The heat dissipation apparatus according to claim 7, wherein the baffle is disposed on the first block, and the baffle does not contact the bottom plate of the container.

9. The heat dissipation apparatus according to claim 8, wherein the diversion module further comprises a liquid outlet portion, the liquid outlet portion comprises a guide groove and a guide pipe; wherein the guide groove is disposed on an upper portion of the second side plate, and is disposed above the first liquid outlet, the guide groove is connected to the guide pipe, and the guide pipe covers the first liquid outlet.

10. The heat dissipation apparatus according to claim 9, wherein the baffle, the restriction box, the guiding groove, and the guide pipe are all fixedly connected to the second side plate by plastic welding.

11. A heat dissipation system comprising:
a plurality of heat-generating electrical devices; and
a heat dissipation apparatus dissipating heat of the plurality of heat-generating electrical devices; wherein the heat dissipation apparatus comprises a container, the container contains coolant liquid and the plurality of heat-generating electrical devices;
wherein the container comprises a bottom plate, two first side plates, and two second side plates; wherein the two first side plates are oppositely disposed, and the two second side plates are oppositely disposed;
wherein the bottom plate, the two first side plates, and the two second side plates forms a first accommodation space for placing the plurality of heat-generating electrical devices; and
wherein the first side plate is fixedly connected to the bottom plate by plastic welding, the second side plate is fixedly connected to the bottom plate by plastic welding, and the first side plate is fixedly connected to the second side plate by plastic welding;
wherein a diversion module is disposed in the container, the diversion module regulates the coolant liquid into the container, the diversion module comprises a liquid inlet portion, the liquid inlet portion comprises a cushion block, the cushion block comprises a plurality of second blocks, and the second blocks are spaced from each other to form a diversion channel.

12. The heat dissipation system according to claim 11, wherein the heat dissipation apparatus further comprises a bracket, and the bracket is sleeved on the outside of the container for receiving and carrying the container.

13. The heat dissipation system according to claim 12, wherein the heat dissipation apparatus further comprises a cover plate, the container defines a first opening, one end of the cover plate is movably connected to the bracket and can cover the first opening of the container.

14. The heat dissipation system according to claim 11, wherein the container further comprises a first slot plate, a second slot plate, and two third side plates, and the two third side plates are oppositely disposed; wherein the first slot plate, the second slot plate, the two third side plates, and the two second side plates form a second accommodation space; and wherein the first slot plate is vertically connected to the two second side plates by plastic welding, the second slot plate is vertically connected to the two second side plates by plastic welding, and the two third side plate is vertically connected to the first slot plate and the second slot plate by plastic welding.

15. The heat dissipation system according to claim 14, wherein the second side plate defines a liquid inlet, a first liquid outlet and a second liquid outlet; and wherein the liquid inlet introduces the coolant liquid into the container, and the first liquid outlet and the second liquid outlet discharges the coolant liquid from the container.

16. The heat dissipation system according to claim 15, wherein the diversion module further leads the coolant liquid out of the container.

17. The heat dissipation system according to claim 16, wherein the liquid inlet portion further comprises a baffle, a deflector, and a restriction box, and the cushion block further comprises a plurality of first blocks; wherein the plurality of second blocks are arranged side by side on the bottom plate of the container, and the baffle cover the diversion channel; wherein the deflector is disposed on the second block, the deflector defines a deflector hole, and the deflector hole corresponds to the diversion channel; and wherein the restriction box is fixedly disposed on the second side plate and covers the liquid inlet.

18. The heat dissipation system according to claim 17, wherein the baffle is disposed on the first block, and the baffle does not contact the bottom plate of the container.

19. The heat dissipation system according to claim 18, wherein the diversion module further comprises a liquid outlet portion, the liquid outlet portion comprises a guide groove and a guide pipe; wherein the guide groove is disposed on an upper portion of the second side plate, and is disposed above the first liquid outlet, the guide groove is connected to the guide pipe, and the guide pipe covers the first liquid outlet.

20. The heat dissipation system according to claim 19, wherein the baffle, the restriction box, the guiding groove, and the guide pipe are all fixedly connected to the second side plate by plastic welding.

* * * * *